(12) United States Patent
Aikawa et al.

(10) Patent No.: US 9,640,756 B2
(45) Date of Patent: May 2, 2017

(54) METHOD FOR MANUFACTURING MAGNETIC MEMORY

(71) Applicants: Hisanori Aikawa, Seoul (KR); Masayoshi Iwayama, Seoul (KR)

(72) Inventors: Hisanori Aikawa, Seoul (KR); Masayoshi Iwayama, Seoul (KR)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 0 days.

(21) Appl. No.: 14/808,347

(22) Filed: Jul. 24, 2015

(65) Prior Publication Data

US 2016/0268502 A1 Sep. 15, 2016

Related U.S. Application Data

(60) Provisional application No. 62/131,772, filed on Mar. 11, 2015.

(51) Int. Cl.
| | |
|---|---|
| *H01L 43/12* | (2006.01) |
| *H01L 43/02* | (2006.01) |
| *H01L 43/08* | (2006.01) |
| *H01L 21/66* | (2006.01) |

(52) U.S. Cl.
CPC ............ *H01L 43/12* (2013.01); *H01L 22/14* (2013.01); *H01L 43/02* (2013.01); *H01L 43/08* (2013.01)

(58) Field of Classification Search
CPC ................................ H01L 22/14; H01L 43/12
See application file for complete search history.

(56) References Cited

U.S. PATENT DOCUMENTS

| | | | |
|---|---|---|---|
| 6,211,035 B1 | 4/2001 | Moise et al. | |
| 6,366,506 B1* | 4/2002 | Mizuno | G11C 5/147 |
| | | | 365/189.09 |
| 7,236,392 B2* | 6/2007 | Saruki | G11C 11/16 |
| | | | 360/324.2 |
| 8,796,042 B2 | 8/2014 | Shin et al. | |
| 2008/0192374 A1* | 8/2008 | Matsubara | B82Y 25/00 |
| | | | 360/31 |
| 2009/0168259 A1* | 7/2009 | Marley | G11B 5/3173 |
| | | | 360/319 |
| 2011/0078538 A1* | 3/2011 | Ikegawa | G11C 11/1675 |
| | | | 714/758 |
| 2012/0135273 A1* | 5/2012 | Horng | C23C 14/3414 |
| | | | 428/828.1 |
| 2013/0000103 A1* | 1/2013 | Yanagisawa | G11B 5/3166 |
| | | | 29/593 |
| 2013/0077404 A1* | 3/2013 | Nawata | G11C 16/10 |
| | | | 365/185.17 |
| 2014/0139209 A1* | 5/2014 | Lee | G01R 33/02 |
| | | | 324/211 |

(Continued)

FOREIGN PATENT DOCUMENTS

JP 2009267371 A 11/2009

*Primary Examiner* — Joseph C Nicely
(74) *Attorney, Agent, or Firm* — Holtz, Holtz & Volek PC

(57) ABSTRACT

According to one embodiment, a method for manufacturing a magnetic memory is disclosed. The method includes forming a magnetoresistive element on a substrate. The method further includes measuring an electrical characteristic of the magnetoresistive element, and applying a voltage to the magnetoresistive element which the electrical characteristic is measured.

19 Claims, 18 Drawing Sheets

(56) References Cited

U.S. PATENT DOCUMENTS

| | | | |
|---|---|---|---|
| 2015/0263274 A1* | 9/2015 | Miyata | H01L 43/12 335/302 |
| 2015/0301802 A1* | 10/2015 | Katoh | G06F 5/01 708/190 |
| 2015/0309737 A1* | 10/2015 | Kim | G06F 3/0611 711/103 |
| 2015/0369857 A1* | 12/2015 | Nakamura | G01R 31/2855 438/15 |
| 2016/0055894 A1* | 2/2016 | Houssameddine | G11C 11/1659 365/158 |
| 2016/0075945 A1* | 3/2016 | Iwashita | C09K 19/3003 252/299.63 |
| 2016/0078914 A1* | 3/2016 | DeBrosse | G11C 11/1673 365/158 |
| 2016/0133320 A1* | 5/2016 | Siau | G11C 13/004 365/148 |

\* cited by examiner

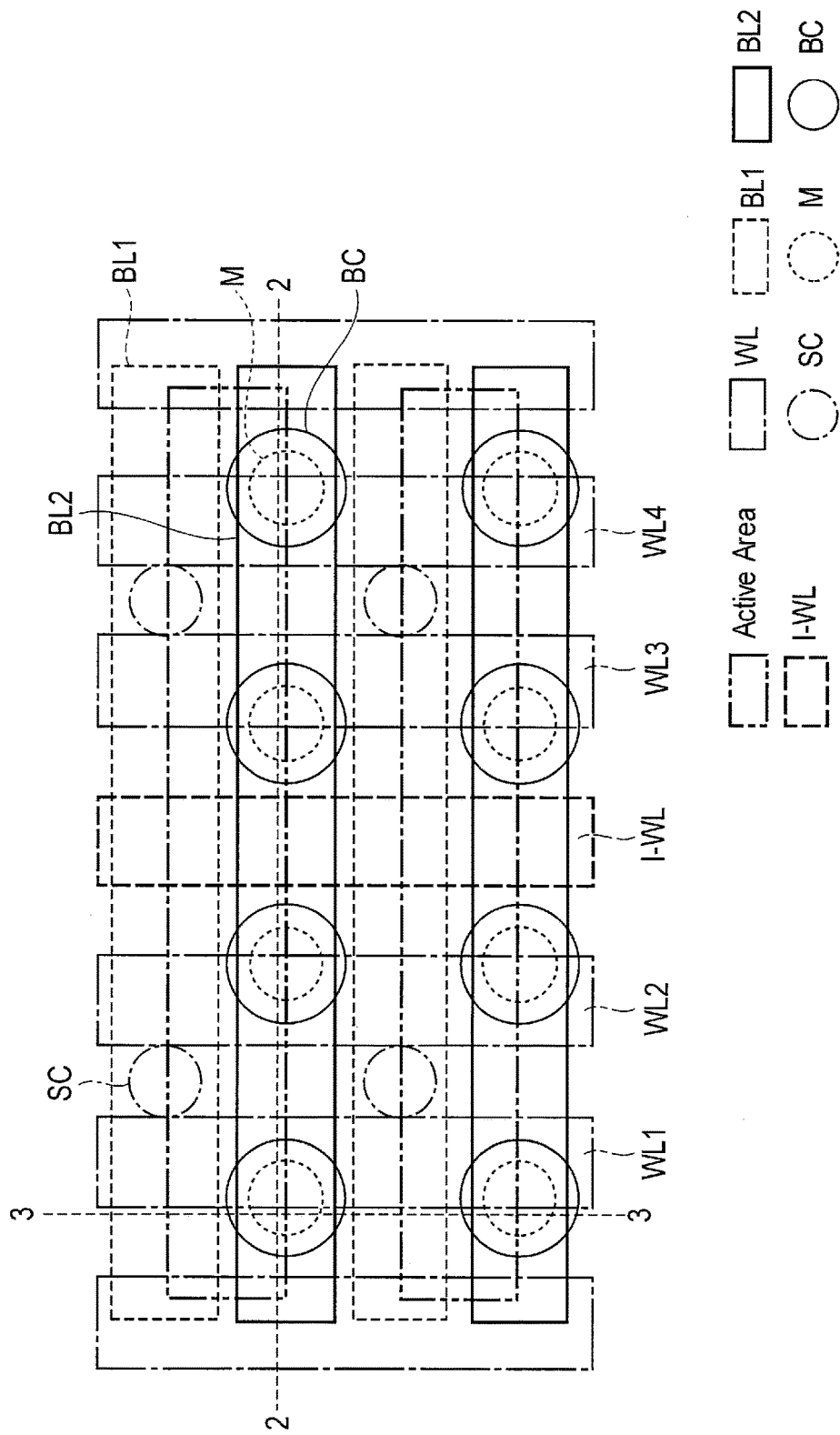
F I G. 1

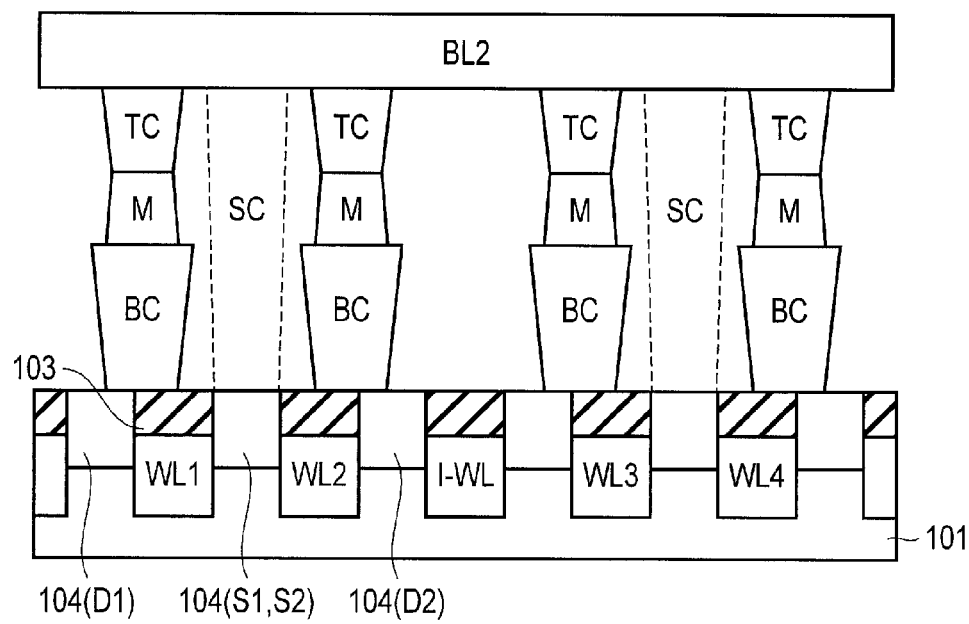
F I G. 2
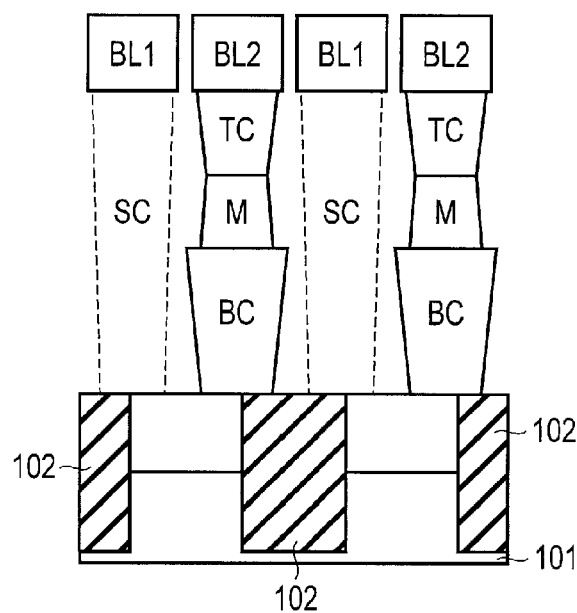
F I G. 3

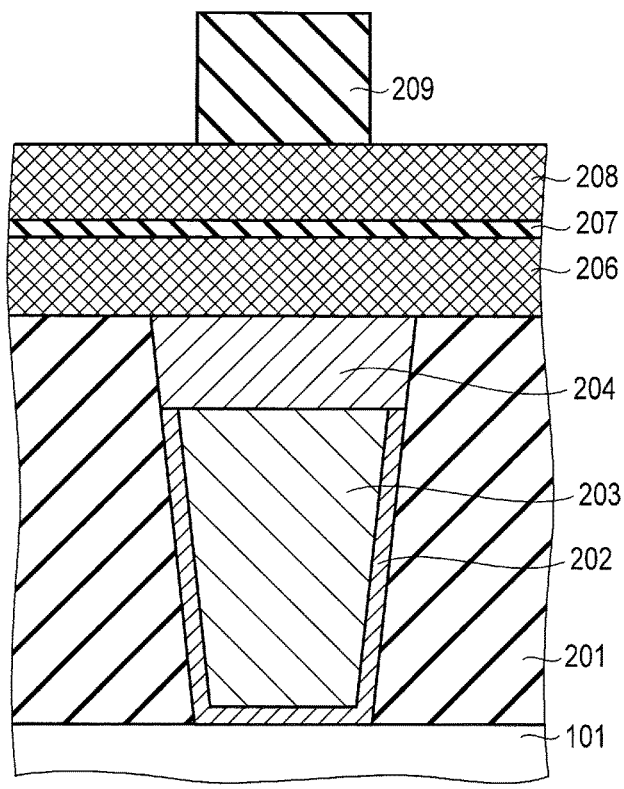
F I G. 8
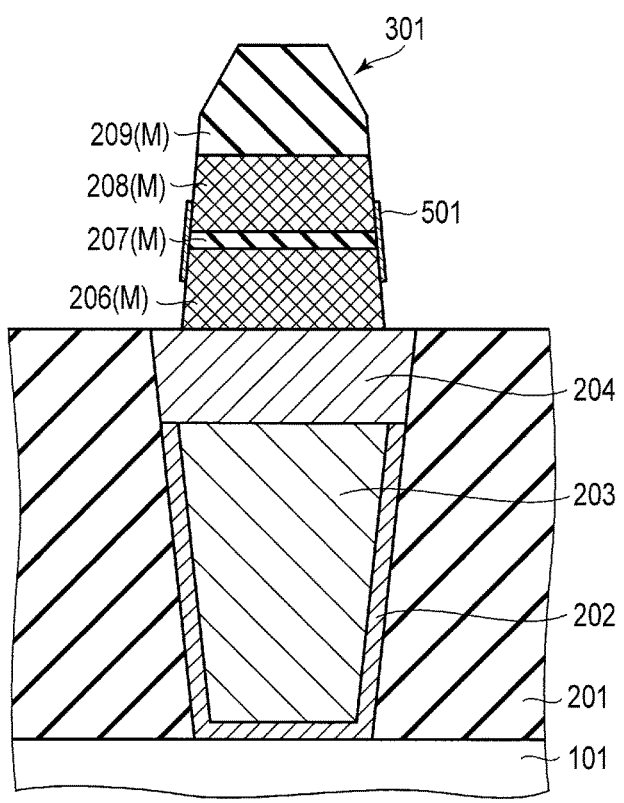
F I G. 9

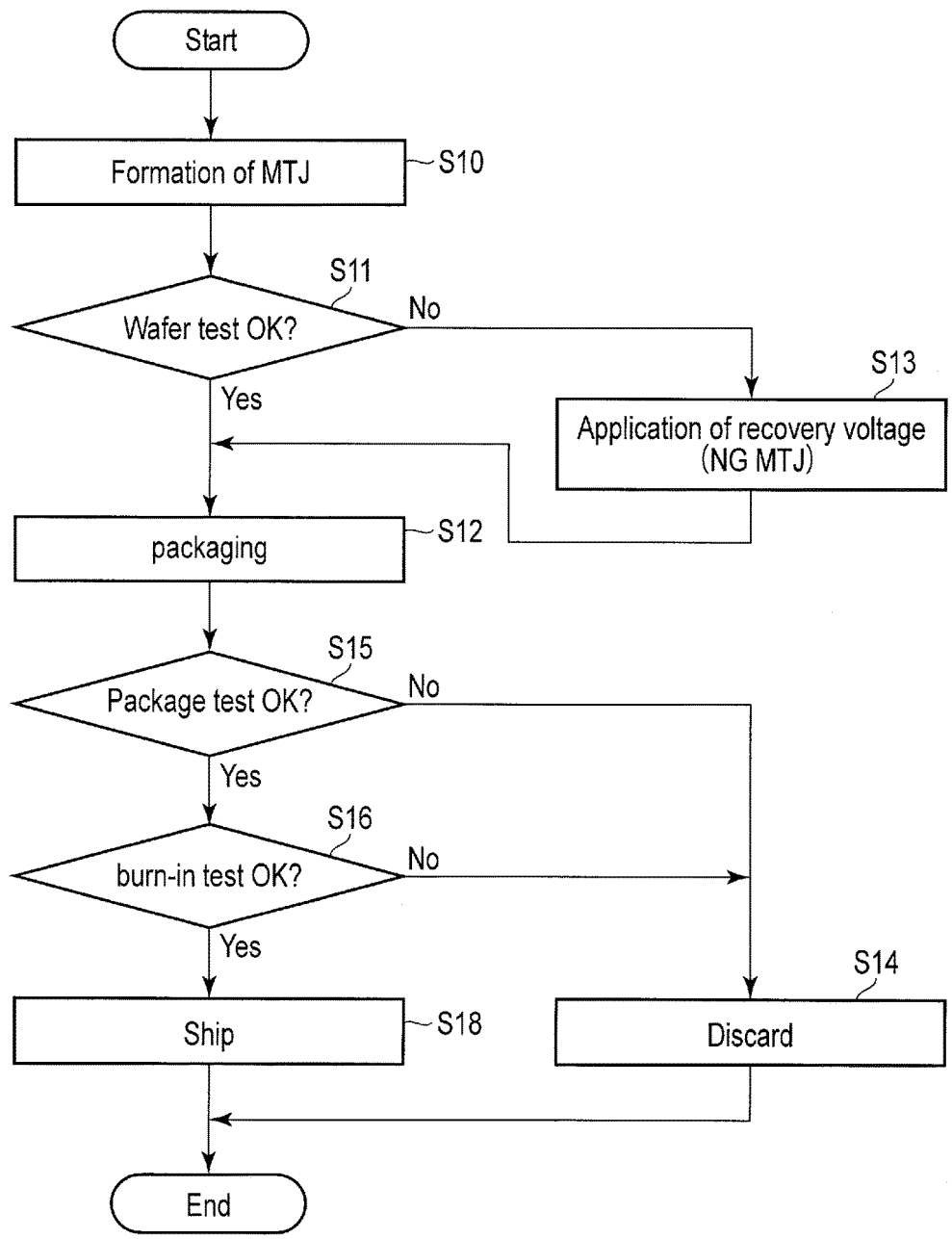
F I G. 18

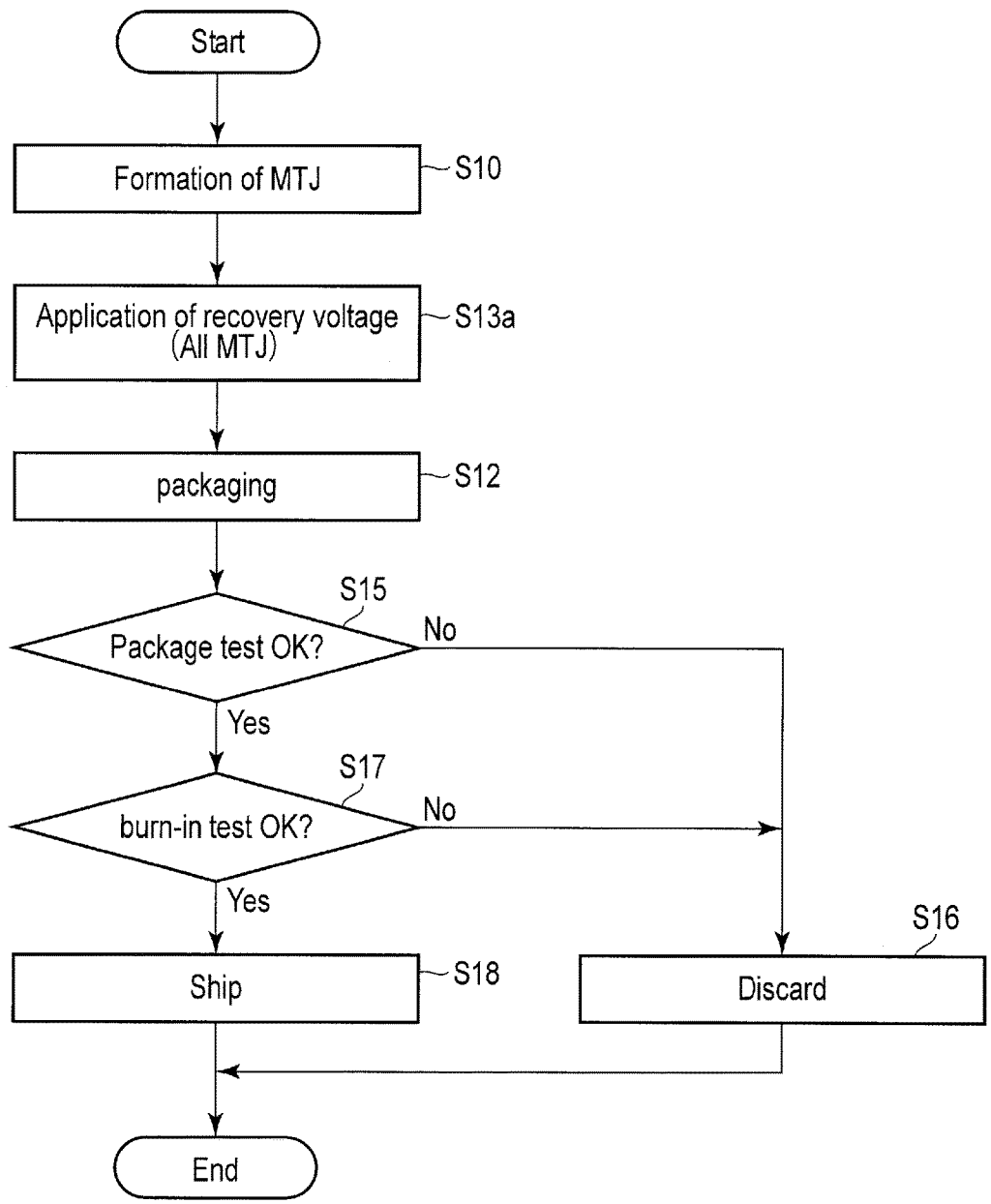
F I G. 20

METHOD FOR MANUFACTURING MAGNETIC MEMORY

CROSS-REFERENCE TO RELATED APPLICATIONS

This application claims the benefit of U.S. Provisional Application No. 62/131,772, filed Mar. 11, 2015, the entire contents of which are incorporated herein by reference.

FIELD

Embodiments described herein relate generally to a method for manufacturing magnetic memory.

BACKGROUND

Recently, a magnetic random access memory (an MRAM) which uses a magnetoresistive element as a storage element has been developed. As one of magnetoresistive elements, a magnetic tunnel junction (MTJ) element including a three-layered-laminated structure of a storage layer in which the direction of magnetization is variable, a tunnel barrier layer, and a reference layer which maintains a predetermined direction of magnetization is known.

BRIEF DESCRIPTION OF THE DRAWINGS

FIG. 1 is a plan view schematically showing a magnetic memory of according to a first embodiment;

FIG. 2 is a cross-sectional view taken along line 2-2 of FIG. 1;

FIG. 3 is a cross-sectional view taken along broken line 3-3 of FIG. 1;

FIG. 8 is a cross-sectional view for describing the method of manufacturing the magnetic memory according to the first embodiment following FIG. 7;

FIG. 9 is a cross-sectional view for describing the method of manufacturing the magnetic memory according to the first embodiment following FIG. 8;

FIG. 18 is a flowchart showing a modification of the method of manufacturing the magnetic memory according to the second embodiment;

FIG. 20 is a flowchart showing a modification of the method of manufacturing the magnetic memory according to the third embodiment;

DETAILED DESCRIPTION

Figure 4:
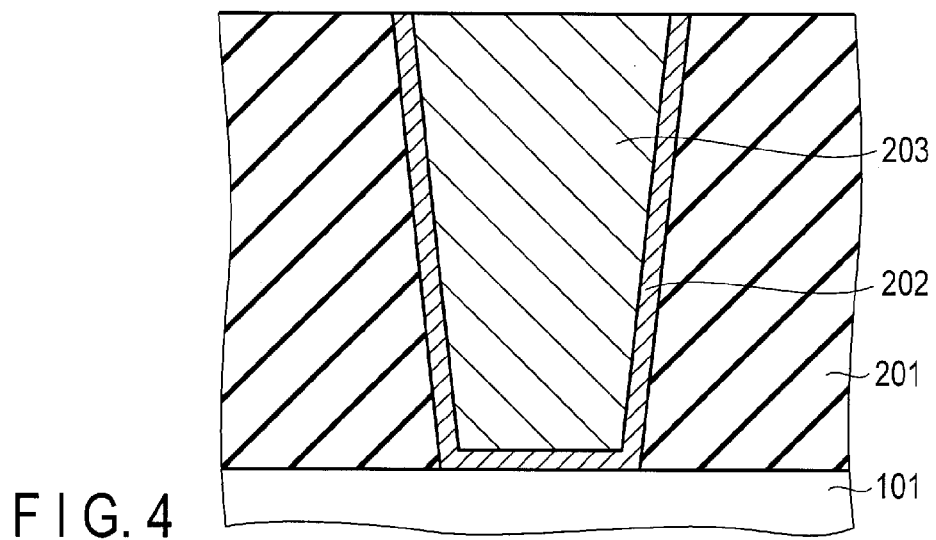
FIG. 4 is a cross-sectional view for describing a method of manufacturing the magnetic memory according to the first embodiment.
Figure 5:
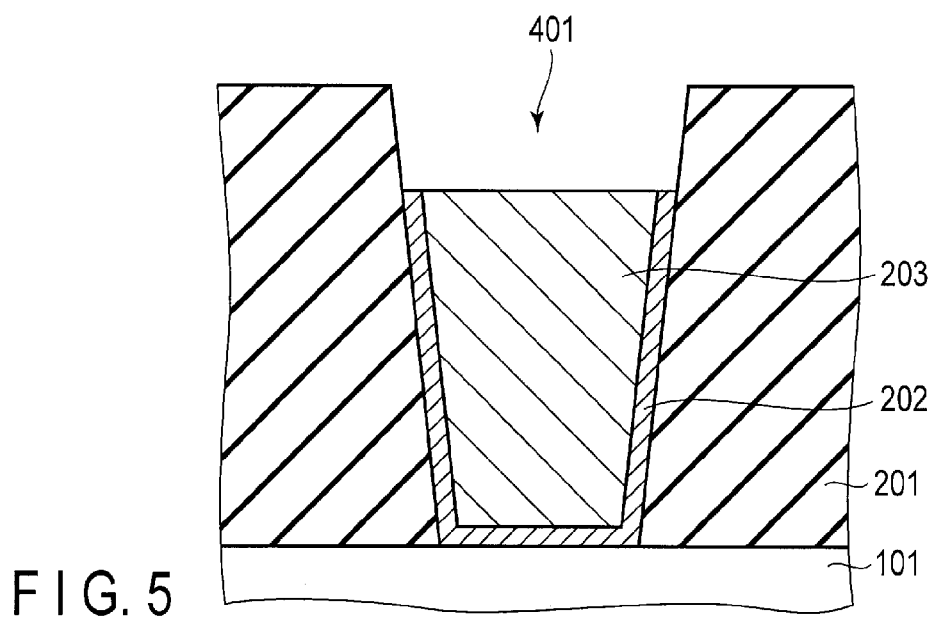
FIG. 5 is a cross-sectional view for describing the method of manufacturing the magnetic memory according to the first embodiment following FIG. 4.
Figure 6:
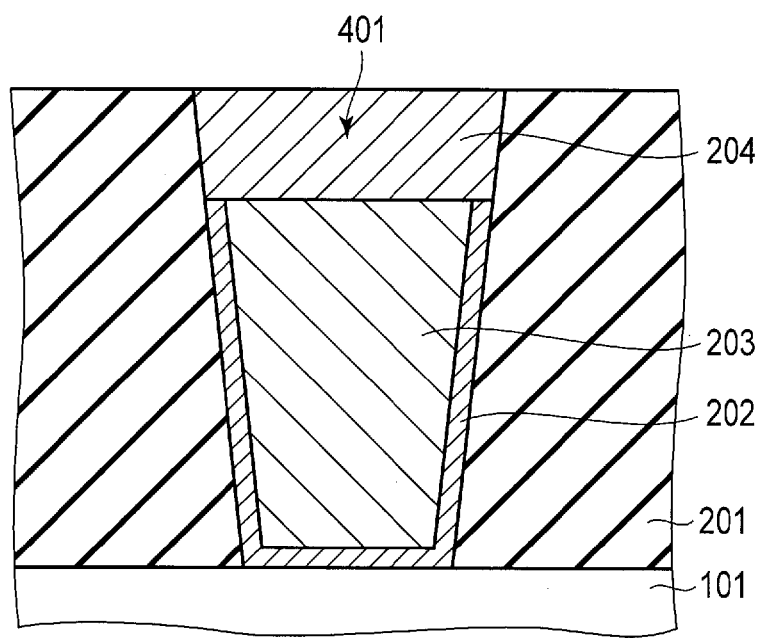
FIG. 6 is a cross-sectional view for describing the method of manufacturing the magnetic memory according to the first embodiment following FIG. 5.
Figure 7:
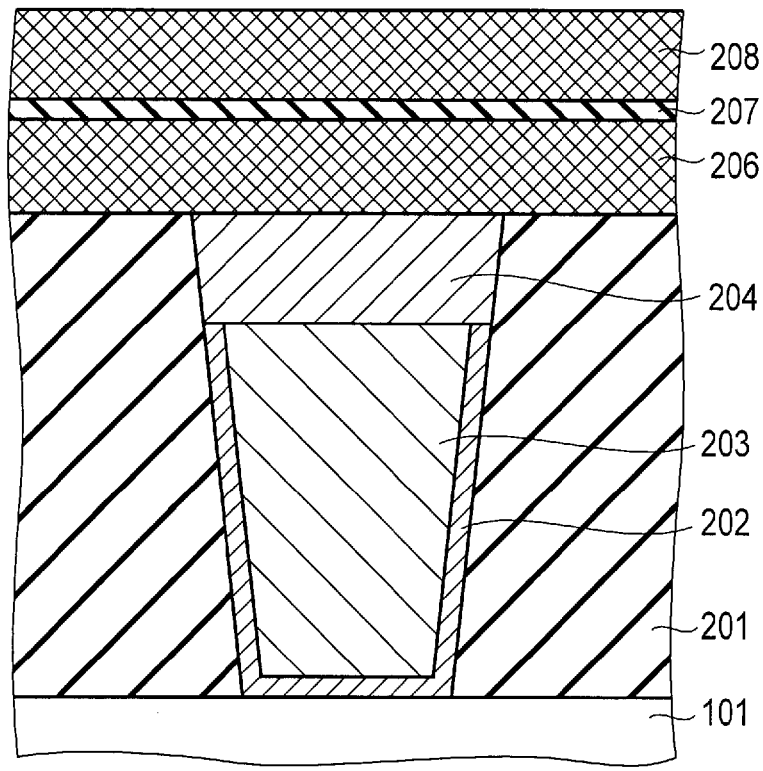
FIG. 7 is a cross-sectional view for describing the method of manufacturing the magnetic memory according to the first embodiment following FIG. 6.
Figure 10:
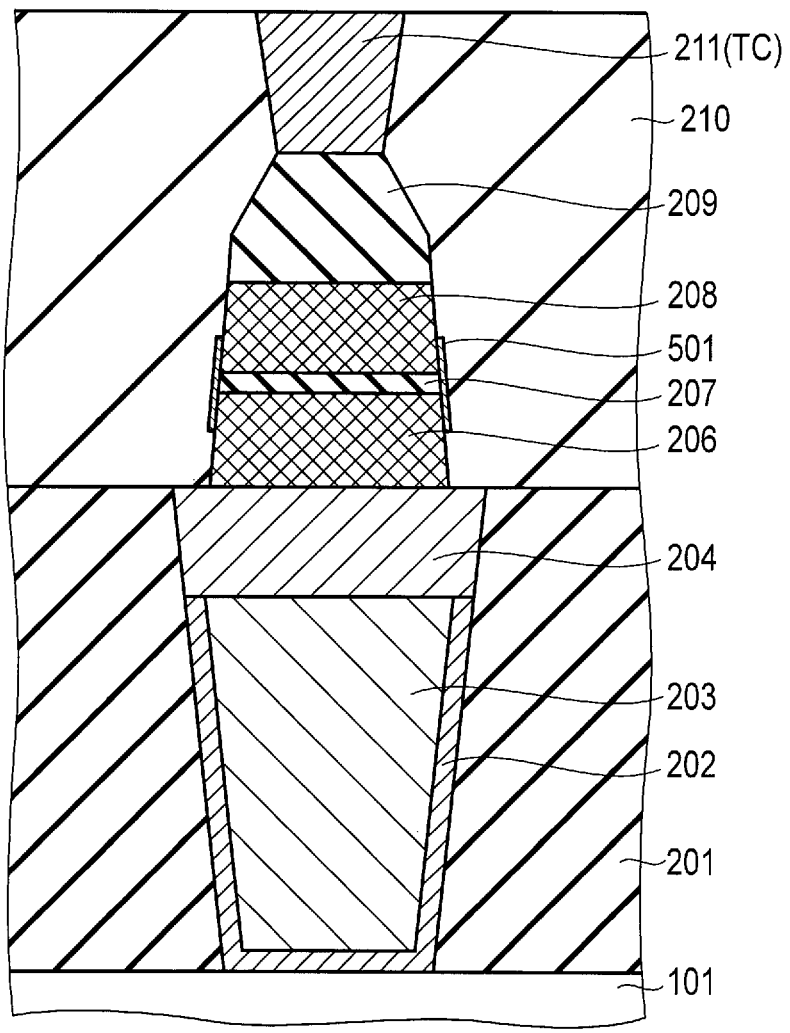
FIG. 10 is a cross-sectional view for describing the method of manufacturing the magnetic memory according to the first embodiment following FIG. 9.
Figure 11:
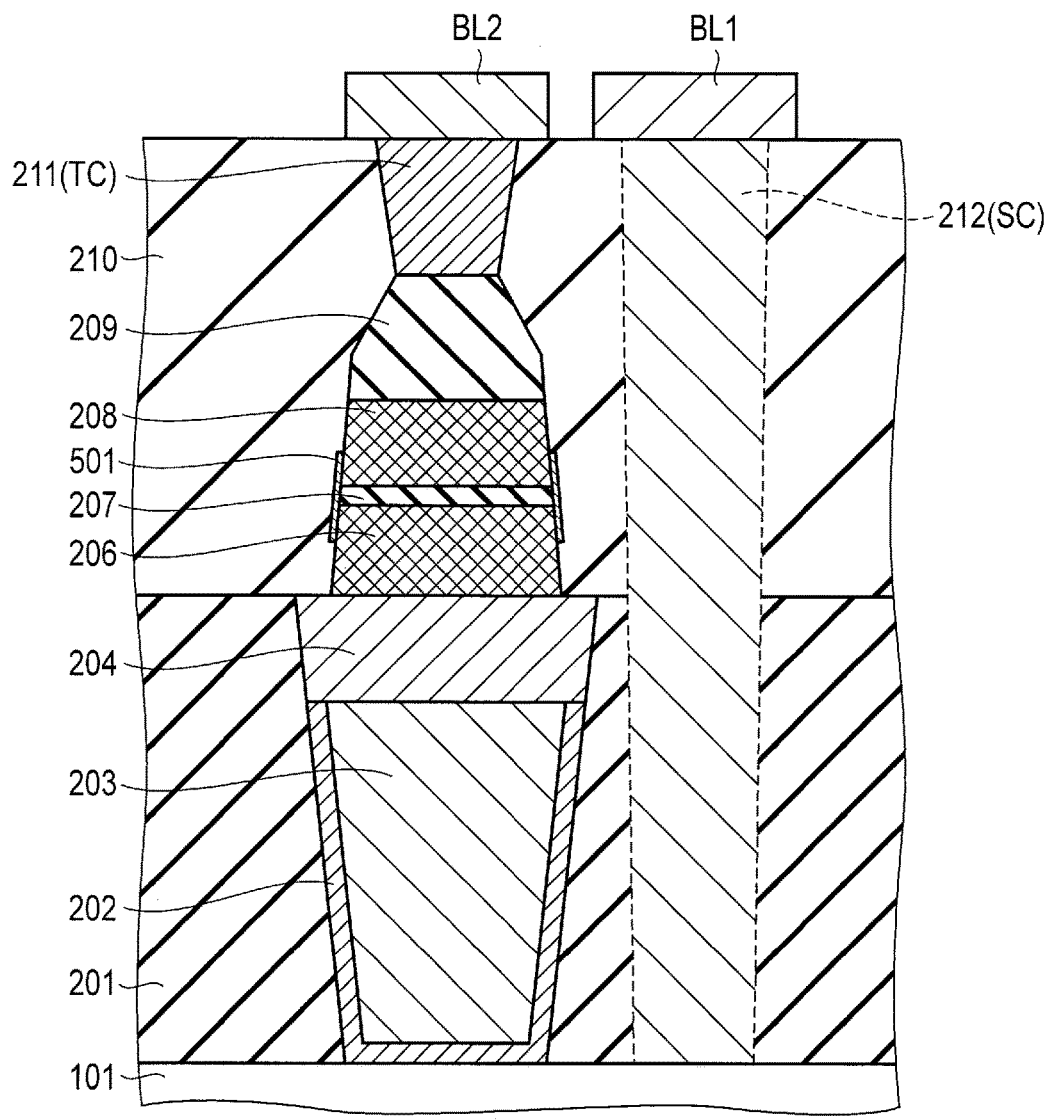
FIG. 11 is a cross-sectional view for describing the method of manufacturing the magnetic memory according to the first embodiment following FIG. 10.
Figure 12:
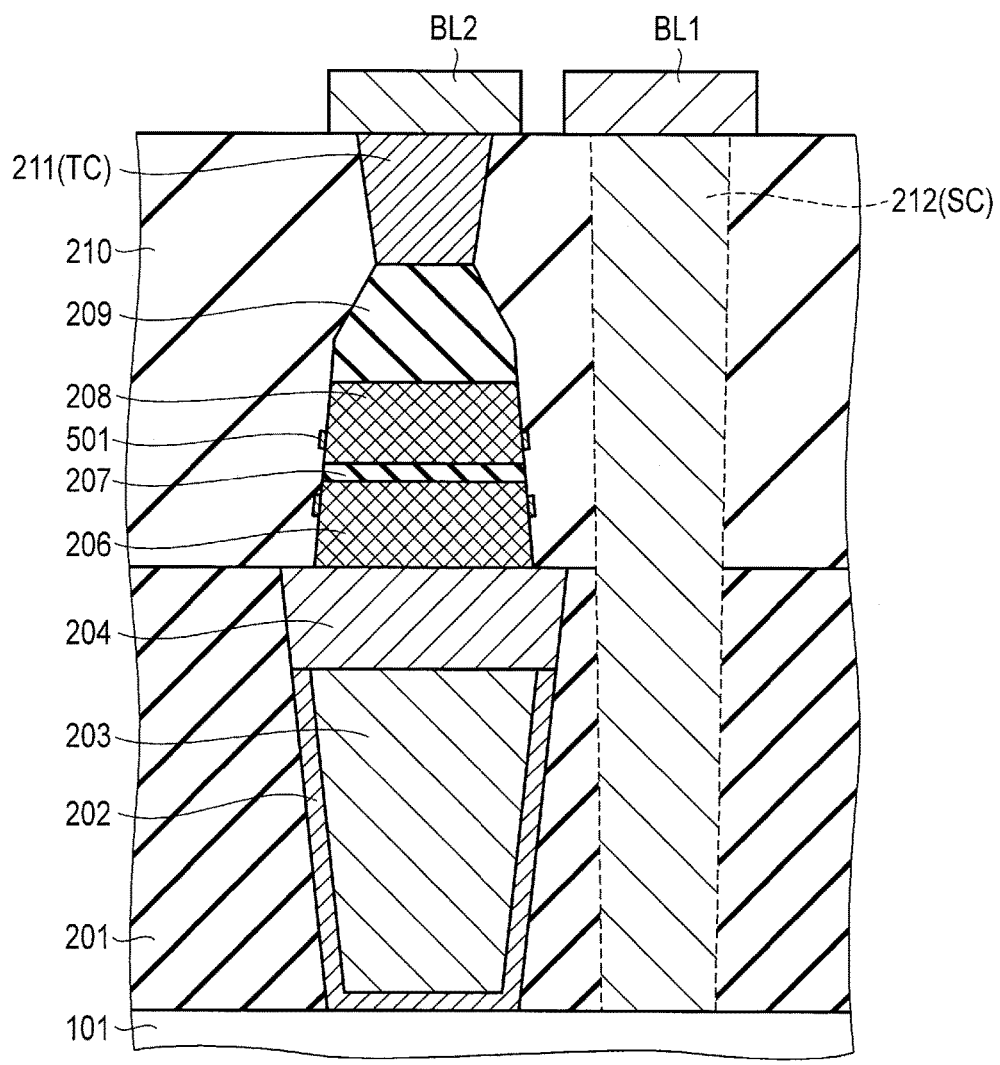
FIG. 12 is a cross-sectional view for describing the method of manufacturing the magnetic memory according to the first embodiment following FIG. 11.

In general, according to one embodiment, a method of manufacturing a magnetic memory is disclosed. The method includes forming a magnetoresistive element on a substrate. The method further includes measuring an electrical characteristic of the magnetoresistive element, and applying a voltage to the magnetoresistive element which the electrical characteristic is measured.

Embodiments will be described hereinafter with reference to the accompanying drawings. In the drawings, a reference number which is the same as the one in the drawings mentioned before (including the case of having a different subscript) indicates the same portion. Further, duplicated descriptions are given as necessary.

First Embodiment

FIG. 1 is a plan view schematically showing a magnetic memory according to a first embodiment, FIG. 2 is a cross-sectional view taken along line 2-2 of FIG. 1, and FIG. 3 is a cross-sectional view taken along broken line 3-3 of FIG. 1. The magnetic memory of the present embodiment is a magnetoresistive random access memory (MRAM) which uses an MTJ element as a storage element.

In the drawings, 101 indicates a silicon substrate (a semiconductor substrate), and an element isolation region 102 is formed in a surface of the silicon substrate 101. The element isolation region 102 defines active areas.

The MRAM of the present embodiment comprises a first select transistor in which a gate electrode is a word line WL1, a first MTJ element M connected to one source/drain region 104 (drain region D1) of the first select transistor, a second select transistor in which a gate electrode is a word line WL2, and a second MTJ element M connected to one source/drain region 104 (drain region D2) of the second select transistor. In the drawings, 103 indicates a cap insulating film.

That is, one memory cell of the embodiment is constituted of one MTJ (memory element) and one select transistor, and two select transistors of the two neighboring memory cells share the other source/drain region 104 (source regions S1, S2).

The gate (gate insulating film, gate electrode) of the select transistor of the present embodiment is buried in the surface of the silicon substrate 101. That is, the gate of the present embodiment has a buried gate (BG) structure. Similarly, the gate (word line I-WL) for element isolation has the BG structure.

One source/drain region 104 (D1) of the first select transistor is connected to a lower part of the first MTJ element M via a plug BC. An upper part of first MTJ element M is connected to a bit line BL2 via a plug TC.

The other source/drain region 104 (S1) of the first select transistor is connected to a bit line BL1 via a plug SC.

In the present embodiment, while planar patterns of the plug BC, the MTJ element M, the plug TC, and the plug SC are circular, however, other shapes may be employed.

One source/drain region 104 (D2) of the second select transistor is connected to a lower part of second MTJ element M via plug a BC. An upper part of second MTJ element M is connected to bit line BL2 via a plug TC.

The other source/drain region 104 (S2) of the second select transistor is connected to the bit line BL1 via the plug SC.

The first select transistor, the first MTJ element M, the second select transistor, and the second MTJ element M (two memory cells) are provided in each active areas. The two neighboring active areas are isolated by the element isolation region 102.

Word lines WL3 and WL4 correspond to the word lines WL1 and WL2, respectively. Accordingly, two memory cells are constituted by a first select transistor in which word the line WL3 is a gate, the first MTJ element M connected to one source/drain region of the first select transistor, a second select transistor in which the word line WL2 is a gate, and a second MTJ element M connected to one source/drain region of the second select transistor.

The magnetic memory of the present embodiment will now be described according to its manufacturing method. FIGS. 4 to 12 are cross-sectional views for describing the method of manufacturing the magnetic memory of the present embodiment.

[FIG. 4]

The above-described isolation area and select transistor (not shown) are formed in the silicon substrate 101 by a well-known method. Subsequently, an interlayer insulating film 201 is formed on the silicon substrate 101, and a contact plug 203 is formed in the interlayer insulating film 201 via a barrier metal film 202 by a well-known damascene process. The shape of the plug including the barrier metal film 202 and the contact plug 203 (plug BC) is a circular truncated cone enlarging toward top.

The interlayer insulating film 201 is, for example, a silicon oxide film. The barrier metal film 202 includes a laminated film of a Ti film and a TiN film, for example. The material of the contact plug 203 includes, for example, tungsten or titanium nitride, and is crystalline. The barrier metal film 202 may be unnecessary depending on the material of contact plug 203. The exposed surfaces of interlayer insulating film 201, the barrier metal film 202 and contact plug 203 are planarized by the chemical mechanical polishing (CMP) process of the above-described damascene process.

[FIG. 5]

By etch-back, the upper parts of the barrier metal film 202 and contact plug 203 are removed. As a result, a concave portion 401 having a taper shape whose width increases toward upward is generated on the surface of the interlayer film 201. The etch-back is carried out by reactive ion etching (RIE) process, for example.

[FIG. 6]

By the damascene process, an underlayer 204 is formed in the concave portion 401, and the surface is planarized. In the present embodiment, the shape of the underlayer 204 is a circular truncated cone. The diameter of the underlayer 204 is increased toward the top. The shape of the underlayer 204 may be a rectangular parallelepiped.

In the present embodiment, the material of the underlayer 204 (material including metal and conductive) includes at least one of tantalum (Ta), titanium (Ti), aluminum (Al), magnesium (Mg), tungsten (W), hafnium (Hf), and zirconium (Zr), for example.

The damascene process includes a step of depositing the material of the underlayer 204, and a step of polishing the deposited material. These steps are performed by using a CMP apparatus.

The barrier metal film 202, the contact plug 203, and the underlayer 204 correspond to plug BC shown in FIGS. 1 to 3.

[FIG. 7]

constituting the MTJ element, which includes a first magnetic layer 206 as a storage layer, a tunnel barrier layer 207, and a second magnetic layer 208 as a reference layer, are sequentially formed on the interlayer insulating film 201 and the underlayer 204. The first magnetic layer 206, the tunnel barrier layer 207, and the second magnetic layer 208 are formed by sputtering process, for example. The material of the tunnel barrier layer 207 is, for example, MgO, AlMgO, or AlN. The thickness of the tunnel barrier layer 207 is, for example, greater than or equal to 0.5 nm and less than or equal to 1.5 nm.

As a layer constituting the MTJ element other than the first magnetic layer 206, the tunnel barrier layer 207, and the second magnetic layer 208 includes, for example, a shift cancelling layer (not shown). The shift cancelling layer is formed on the second magnetic layer 208. The first and the second magnetic layers 206 and 208 may be a reference layer and a storage layer, respectively.

[FIG. 8]

A hard mask 209 having electrical conductivity is formed on the second magnetic layer 208. The hard mask 209 is also used as an upper electrode of the MTJ element. The material of the hard mask 209 is, for example, TiN, Ti, Ta, or W.

[FIG. 9]

The MTJ element 301 is formed by sequentially processing the second magnetic layer 208, the tunnel barrier layer 207 and the first magnetic layer 206 by using IBE process while the hard mask 209 is employed as a mask. The MTJ element 301 includes the layers 206 to 209, and corresponds to MTJ element M shown in FIGS. 1 to 3. The MTJ element 301 has a tapered shape in which the width is narrowed toward the top.

In the middle of the IBE process, a leakage path 501 which shorts the first magnetic layer 206 and the second magnetic layer 208 may be formed by etching residue of the underlayer 204 adhering onto a sidewall of a layered product 206, 207, and 208. In the following description, it is assumed that the leakage path 501 is formed.

[FIG. 10]

An interlayer insulating film 210 is formed on the entire surface of the MTJ element side, and a surface of the interlayer insulating film 210 is planarized by CMP process. The interlayer insulating film 210 is, for example, a silicon oxide film. The interlayer insulating film 210 is, for example, formed by a CVD process.

By using a damascene process, a connection hole reaching the hard mask 209 is formed in interlayer insulating film 210, and a contact plug 211 is formed in the connection hole. The contact plug 211 corresponds to the plug TC shown in FIGS. 1 to 3.

[FIG. 11]

In a similar manner, by using the damascene process, a connection hole reaching the other one of the source/drain areas 104 (S1) of the first select transistor shown in FIG. 2 is formed in the interlayer insulating film 210, and the contact plug 212 is formed in the connection hole. The contact plug 212 corresponds to the plug SC shown in FIGS. 1 to 3. After that, bit line BL2 and bit line BL1 are formed on the contact plugs 211 and 214, respectively.

[FIG. 12]

By applying a voltage between the first magnetic layer 206 and the second magnetic layer 208, a current flows through the leakage path 501 which shorts the first magnetic layer 206 and the second magnetic layer 208. The application of the voltage is carried out in an atmosphere of a temperature which is greater than or equal to room temperature (for example, 27° C.) and below 90° C.

By the above-mentioned current, the leakage path 501 is either divided or a part of the leakage path 501 becomes an insulator, whereby a short between the first magnetic layer 206 and the second magnetic layer 208 by the leakage path 501 is eliminated. Accordingly, by the application of the voltage, a defective MTJ element in which the first magnetic layer 206 and the second magnetic layer 208 are short-circuited by the leakage path 501 can be recovered to a normal MTJ element.

The voltage applied between the first magnetic layer 206 and the second magnetic layer 208 to recover the defective MTJ element to the normal MTJ element as described above will be hereinafter referred to as a recovery voltage.

The recovery voltage is smaller than a breakdown voltage of the tunnel barrier layer 207. This is for preventing the MTJ element from being broken by the application of the recovery voltage. When the tunnel barrier layer 207 is an MgO layer, the breakdown voltage is approximately 1.2 V. The thickness of the MgO layer is, for example, greater than or equal to 0.5 nm and less than or equal to 1.5 nm.

The recovery voltage is higher than a voltage for normal operation (a write voltage, a read voltage) of the MTJ element. The reason for this is that a voltage for normal operation is insufficient to generate a large current for burning off the leakage path 501. In general, the recovery voltage is set higher than the write voltage since the write voltage is higher than the read voltage. The write voltage is, for example, 0.5 V. Accordingly, as an instance, the recovery voltage is greater than 0.5 V and less than 0.9 V. Moreover, an application time of the recovery voltage is 10 nanoseconds or more or, for example, several tens of nanoseconds or more, and more specifically, 20 nanoseconds or 30 nanoseconds or more.

Figure 13:
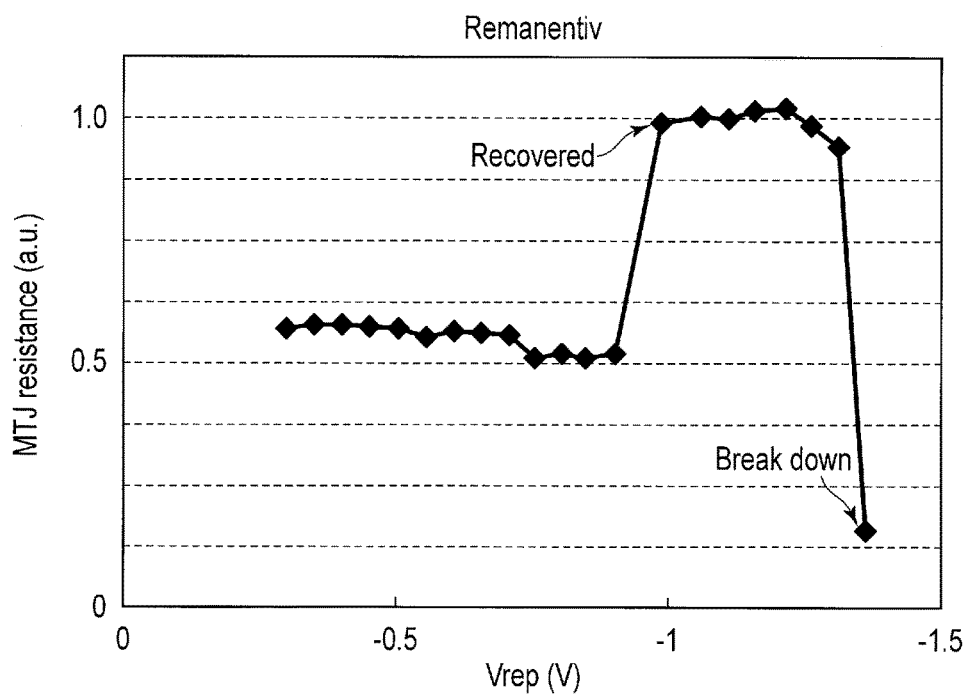
FIG. 13 is an illustration showing the relationship between recovery voltage Vrep and MTJ resistance.

FIG. 13 is an illustration showing the relationship between recovery voltage Vrep and MTJ resistance. The MTJ resistance is increased within the range of approximately 0.98 V<Vrep<approximately 1.36 V, and the MTJ resistance is decreased when Vrep approximately 1.36 V.

Figure 14:
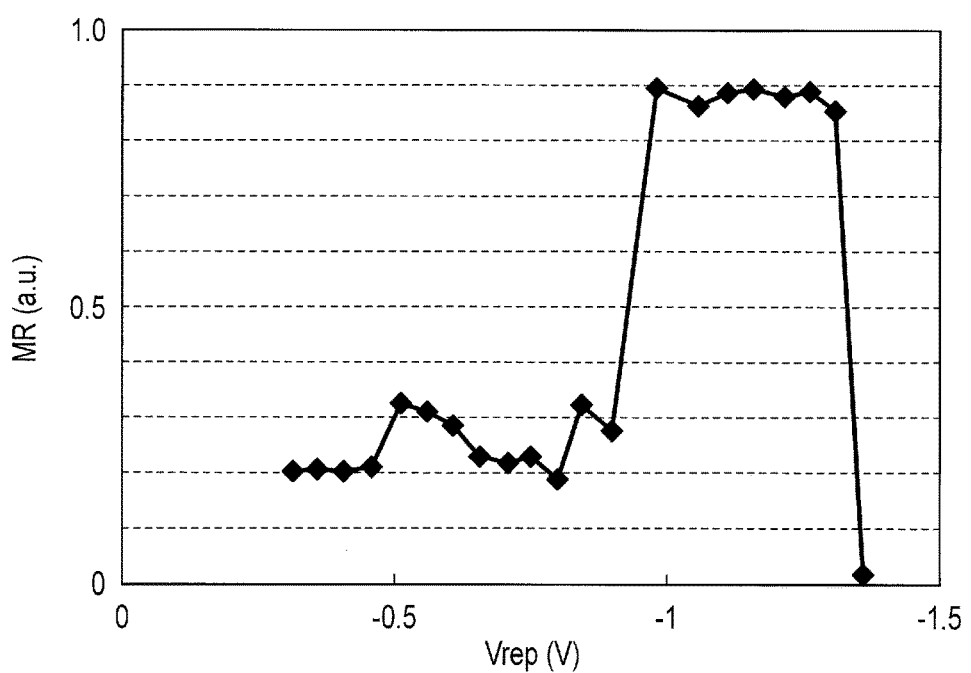
FIG. 14 is an illustration showing the relationship between recovery voltage Vrep and MR ratio.

FIG. 14 is an illustration showing the relationship between recovery voltage Vrep and magnetoresistance ratio (MR). The MR ratio is increased within the range of approximately 0.98 V<Vrep<approximately 1.36 V, and the MR ratio is decreased when Vrep approximately 1.36 V.

The results of FIG. 13 and FIG. 14 are considered that the leakage path is burnt off in the range of approximately 0.98 V<Vrep<approximately 1.36 V, and the tunnel barrier layer is broken down when Vrep>approximately 1.36 V. The defective MTJ element can be effectively recovered to the normal MTJ element by employing previously searched voltage that does not breakdown the tunneling barrier layer as the recovery voltage.

Figure 15:
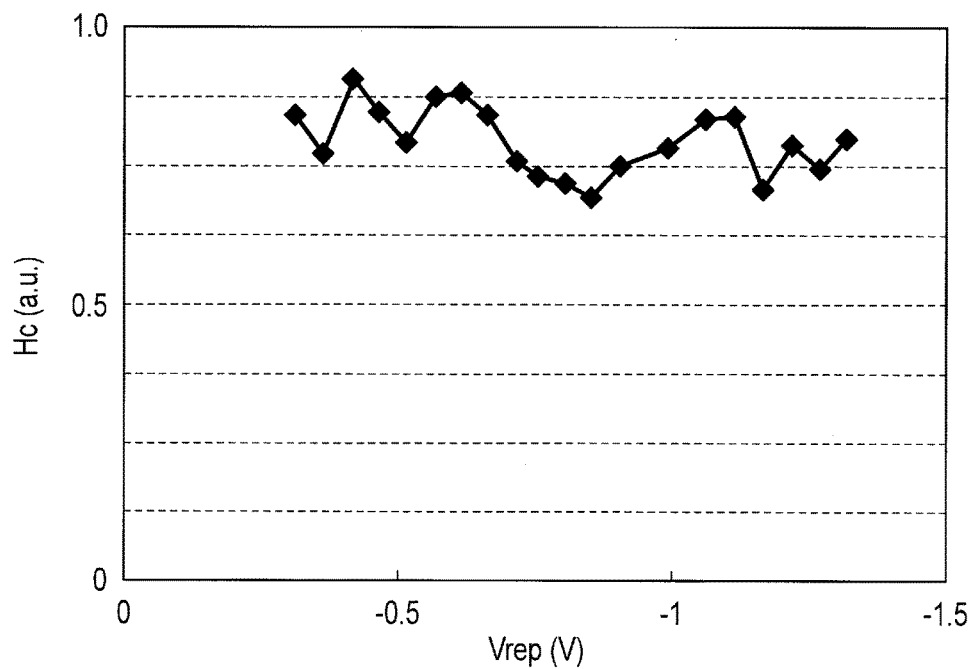
FIG. 15 is an illustration showing the relationship between recovery voltage Vrep and coersive force Hc of a storage layer.

FIG. 15 is an illustration showing the relationship between recovery voltage Vrep and coersive force Hc of the storage layer. It is considered that the coersive force Hc is not affected by the leakage path since the coersive force Hc does not show remarkable difference whether the value of the recovery voltage Vrep is lower than a specific value or higher than the specific value.

Figure 16:
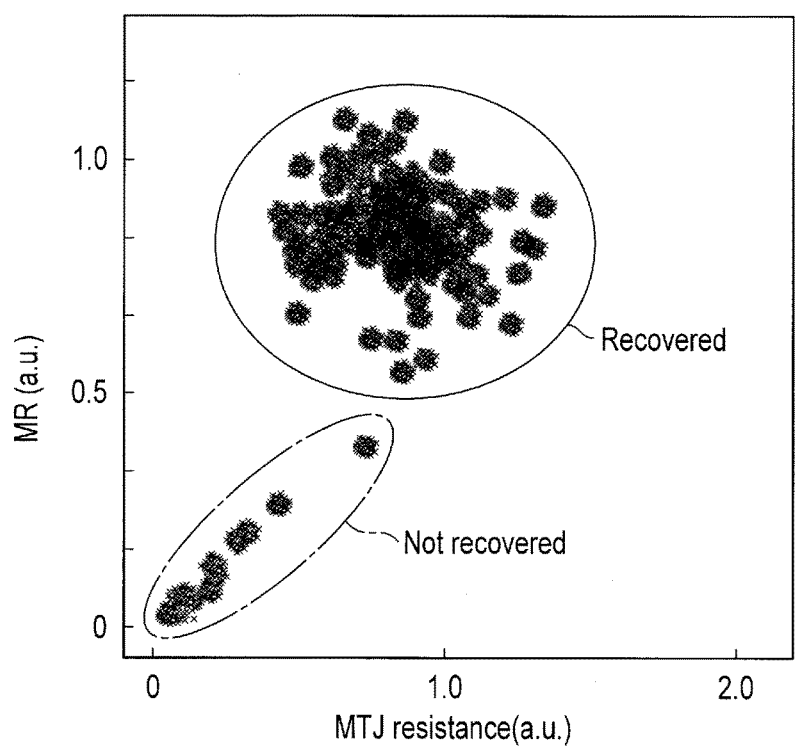
FIG. 16 is an illustration showing the relationship between MTJ resistance and MR ratio of a plurality of defective MTJ elements when a recovery voltage is applied to the plurality of defective MTJ elements.

FIG. 16 is an illustration showing the relationship between the MTJ resistance and the MR ratio of a plurality of defective MTJ elements when the recovery voltage is applied to the plurality of defective MTJ elements. It is confirmed that about eighty percent of the defective MTJ elements are recovered to normal MTJ elements by the application of the recovery voltage.

Second Embodiment

Figure 17:
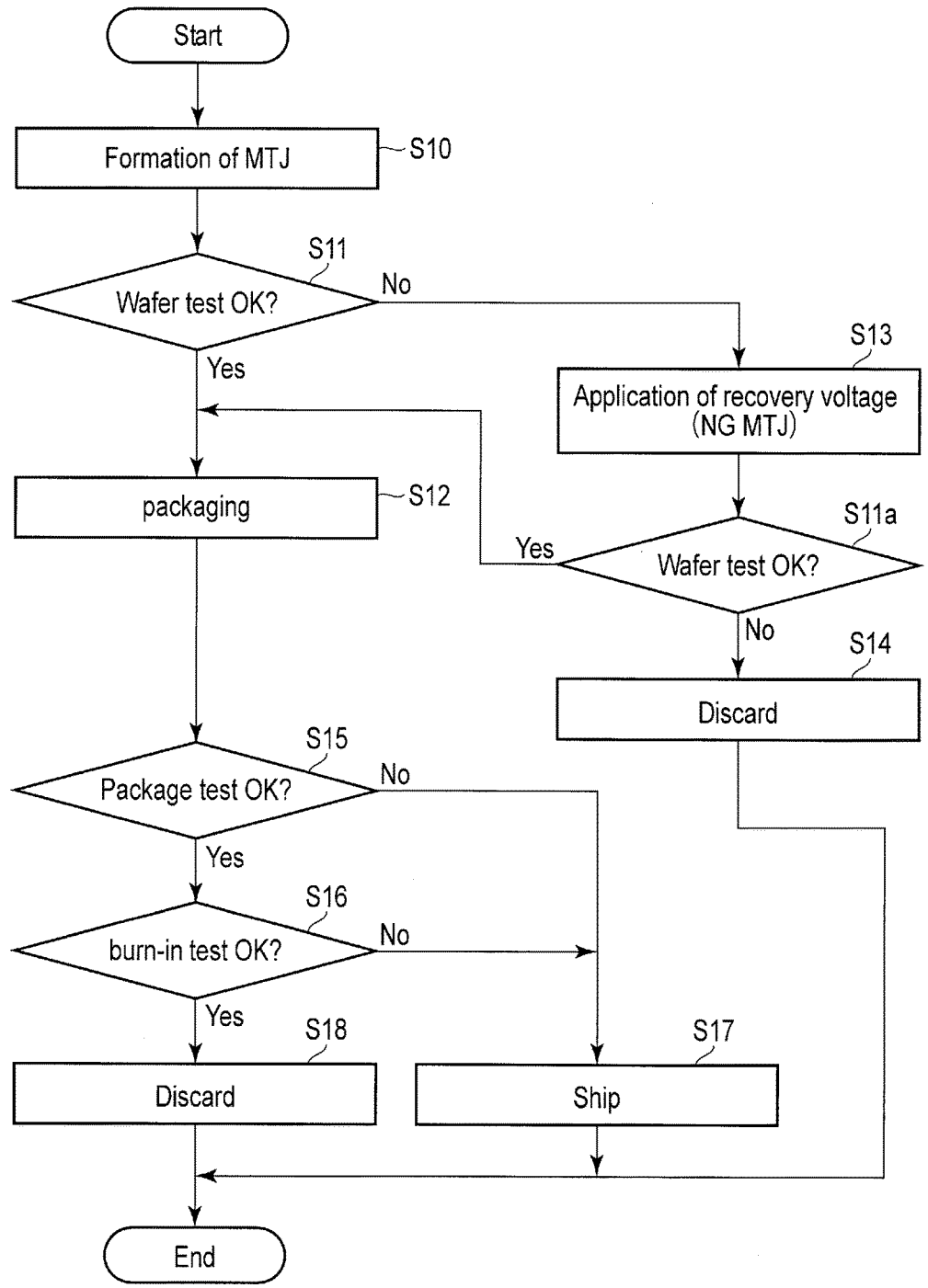
FIG. 17 is a flowchart showing a method of manufacturing a magnetic memory according to a second embodiment.

FIG. 17 is a flowchart for describing a method of manufacturing a magnetic memory according to a second embodiment. In the present embodiment, timing at which the recovery voltage described in the first embodiment is to be applied is defined. In the present embodiment, the application of the recovery voltage (S13) is performed after a wafer test (S11).

[Step S10]

A magnetic memory including a plurality of MTJ elements is formed on a wafer by a well-known method. The material of the wafer is, for example, silicon.

[Step S11]

Electrical characteristics of the plurality of MTJ elements formed on the wafer are measured by a well-known method, and it is determined whether the electrical characteristics of the plurality of MTJ elements are good or not (wafer test).

[Step S12]

In step S11, if it is determined that the electrical characteristics of all of the MTJ elements are good, the wafer is divided into a plurality of chips, and each chip is packaged thereafter.

[Step S13]

Meanwhile, in step S11, if one or more defective MTJ elements are found, the recovery voltage is applied to the one or more defective MTJ elements.

[Step S11a]

It is determined whether the electrical characteristics of the one or more defective MTJ elements to which the recovery voltage is applied are good or not (wafer test). The second wafer test may be carried out under more severe conditions than is the first wafer test.

In step S11a, if it is determined that the electrical characteristics of all of the MTJ elements to which the recovery voltage is applied are good, the method proceeds to step S12.

[Step S14]

Meanwhile, in step S11a, if one or more defective MTJ elements are found, the wafer including the defective MTJ element is discarded, for example.

Alternatively, a chip including one or more defective MTJ elements is discarded (S14), and the other chips (chips including only the good MTJ elements) may be packaged. After that, the method proceeds to step S15.

[Step S15]

It is determined whether the electrical characteristics of the packaged chip (hereinafter referred to as a chip component) are good or not by a well-known method (package test).

[Step S16]

It is determined that the electrical characteristics of the chip component determined as being good in step S15 are good or not by burn-in test. The burn-in test is carried out to find out an initial defect. In the burn-in test, the chip component is operated for a given time in a state where the chip component is applied with load of temperature and voltage, and then the electrical characteristics of the chip component are examined to determine whether the chip component is good or not. For example, in an atmosphere of 90° C. or more, the MTJ element in the chip component is applied with a voltage, and a write test of the MTJ element is performed. The voltage is, for example, a pulse voltage, and the amplitude is 0.3 to 0.4 V and the application time is one hour or longer, for example several hours. Moreover, the upper limit of the application time is, for example, several tens of hours, more specifically, for example, 20 hours or 30 hours. Moreover, the number of times that the pulse voltage is applied is, for example, $1 \times 10^6$.

[Step S17]

Meanwhile, a chip component which is determined as being defective in step S15 is discarded and not be shipped.

[Step S18]

A chip component determined as being good in step S16 is shipped.

FIG. 18 is a flowchart showing a modification of the manufacturing method of the present embodiment. In the manufacturing method of this modification, determination S11a (re-wafer test) performed in the flowchart of FIG. 17 is omitted. In this modification, after step S13 (application of recovery voltage), the method proceeds to step S12 (packaging). In this way, the number of steps can be reduced.

Third Embodiment

Figure 19:
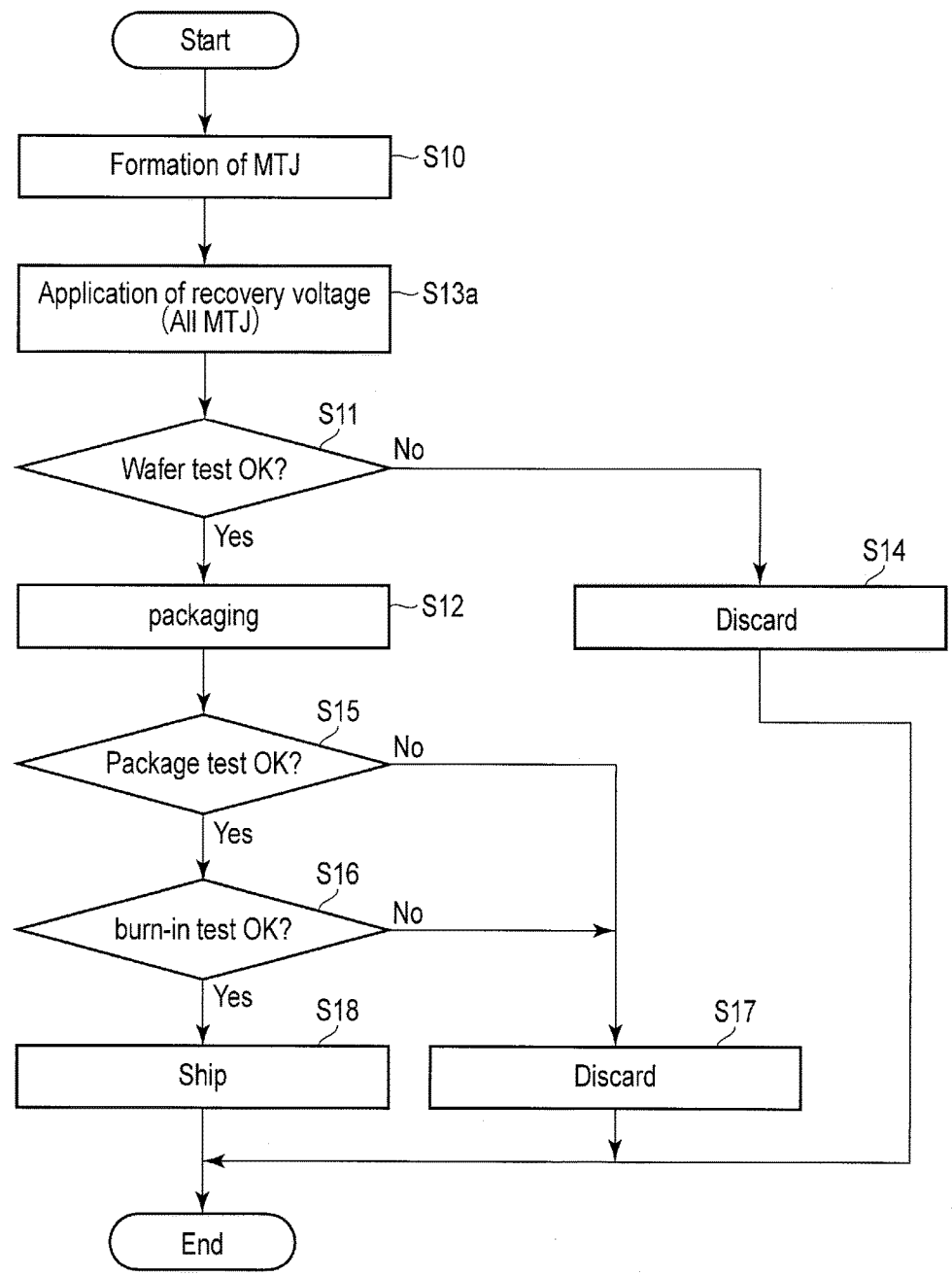
FIG. 19 is a flowchart showing a method of manufacturing a magnetic memory according to a third embodiment.

FIG. 19 is a flowchart for describing a method of manufacturing a magnetic memory according to a third embodiment. In the first embodiment, while the application of a recovery voltage (S13) is performed after the wafer test (S11), in the present embodiment, the application of the recovery voltage (S13a) is performed before the wafer test (S11).

[Step S10]

A magnetic memory including a plurality of MTJ elements is formed on a wafer by a well-known method.

[Step S13a]

The recovery voltage is applied to the plurality of MTJ elements formed on the wafer.

[Step S11]

It is determined whether the plurality of the MTJ elements formed on the wafer are good or not by a well-known method (wafer test).

[Step S12]

In step S11, if all of the MTJ elements are determined as being good, the wafer is divided into a plurality of chips, and each chip is packaged thereafter.

[Step S14]

Meanwhile, in step S11, if one or more defective MTJ elements are found, the wafer including the defective MTJ element is discarded, for example.

Alternatively, a chip including one or more defective MTJ elements is discarded (S14), and the other chips (chips including only the good MTJ elements) may be packaged. After that, the method proceeds to step S15.

Following this, the steps S15 to 18 are performed as in the first embodiment.

FIG. 20 is a flowchart showing a modification of the manufacturing method of the present embodiment. In the manufacturing method of this modification, determination S11 (wafer test) performed in the flowchart of FIG. 19 is omitted. In this way, the number of steps can be reduced.

Fourth Embodiment

Figure 21:
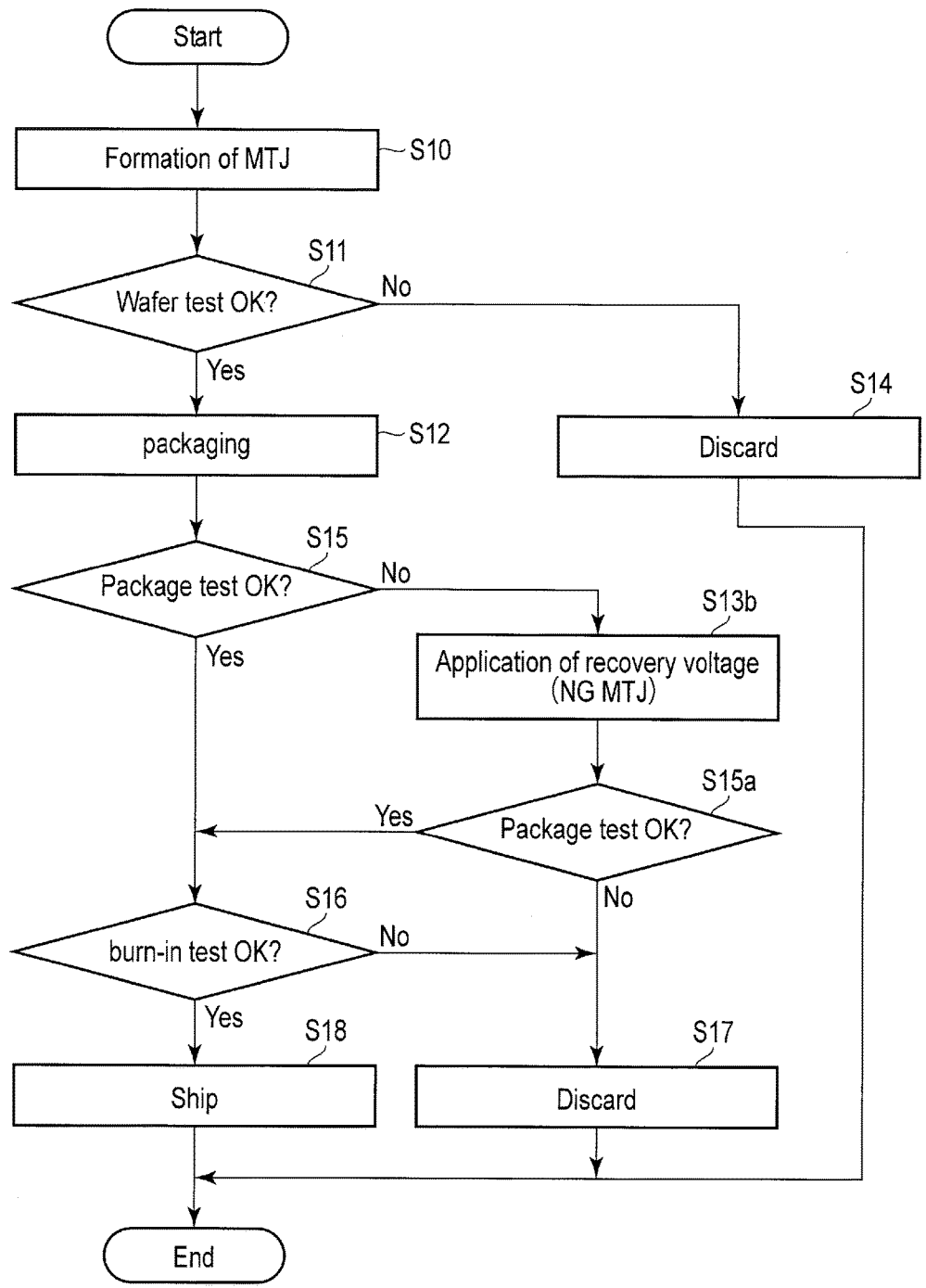
FIG. 21 is a flowchart showing a method of manufacturing a magnetic memory according to a fourth embodiment.

FIG. 21 is a flowchart for describing a method of manufacturing a magnetic memory according to a fourth embodiment. In the first embodiment, while the application of the recovery voltage (step S13) is performed after the wafer test (S11), in the present embodiment, the application of a recovery voltage (step S13b) is performed after a package test (S15).

[Step S10]

A magnetic memory including a plurality of MTJ elements is formed on a wafer by a well-known method.

[Step S11]

It is determined whether the plurality of the MTJ elements formed on the wafer are good or not by a well-known method (wafer test).

[Step S12]

In step S11, if all of the MTJ elements are determined as being good, the wafer is divided into a plurality of chips, and each chip is packaged thereafter.

[Step S14]

Meanwhile, in step S11, if one or more defective MTJ elements are found, the wafer including the defective MTJ element is discarded, for example.

Alternatively, a chip including one or more defective MTJ elements is discarded (S14), and the other chips (chips including only the good MTJ elements) may be packaged. After that, the method proceeds to step S15.

[Step S15]

It is determined whether a chip component is good or not by a well-known method (package test).

[Step S16]

I is determined whether a chip component determined as being good in step S15 is good or not by burn-in test.

[Step S13b]

Meanwhile, in step S15, if a chip including one or more defective MTJ elements is found, the recovery voltage is applied to the chip including the one or more defective MTJ elements.

[Step S15a]

It is determined whether electrical characteristics of the chip, which includes the one or more defective MTJ elements and is applied the recovery voltage, are good or not (package test). The second package test may be carried out under more severe conditions than is the first test.

A chip determined as being good in step S15a proceeds to step S16 (burn-in test).

Meanwhile, a chip component determined as being defective in step S15a is discarded and not shipped.

[Step S18]

A chip component determined as being good in step S16 is shipped.

Meanwhile, a chip component determined as being defective in step S16 is discarded and not shipped (S17).

Figure 22:
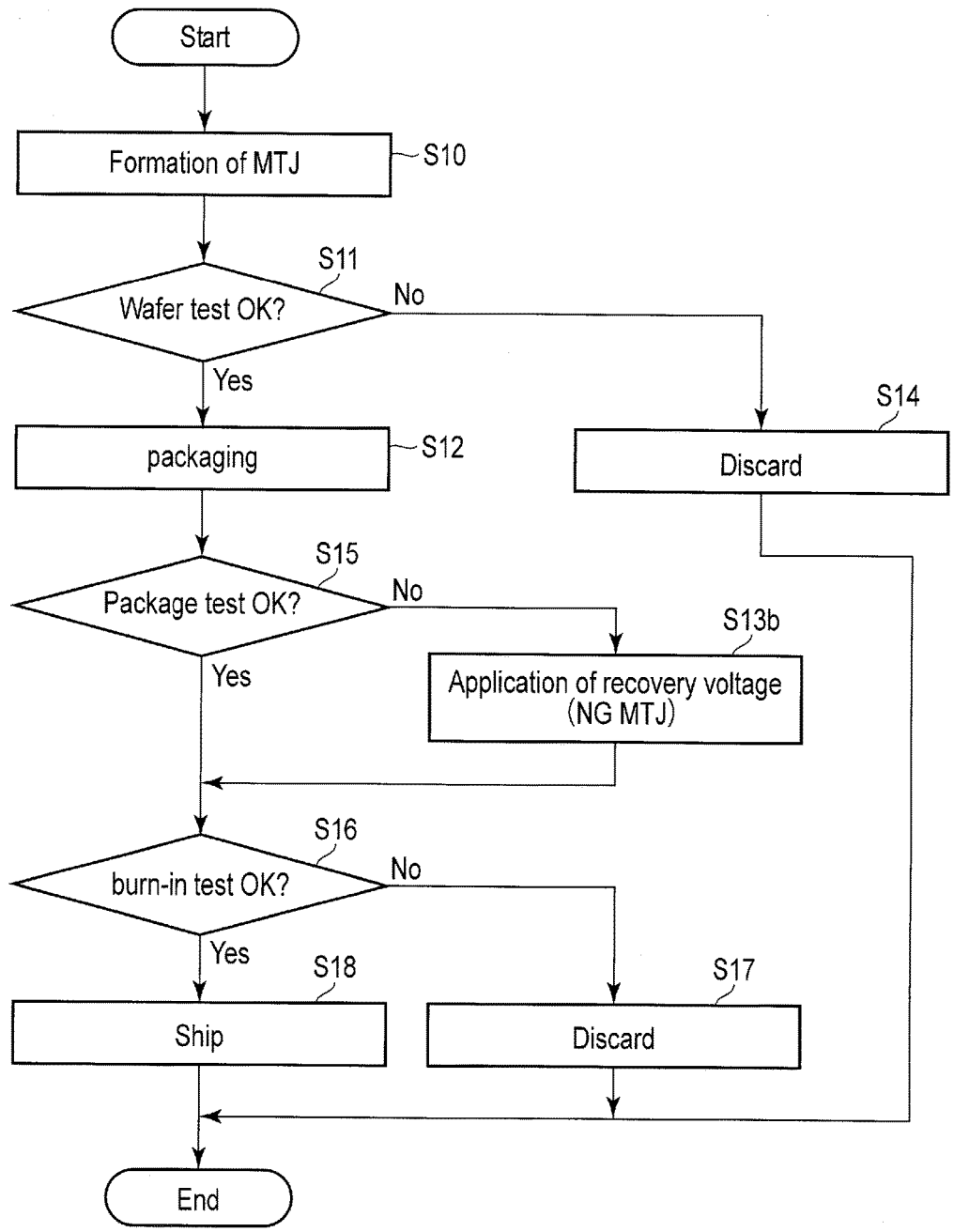
FIG. 22 is a flowchart showing a modification of the method of manufacturing the magnetic memory according to the fourth embodiment.

FIG. 22 is a flowchart showing a modification of the manufacturing method of the present embodiment. In the manufacturing method of this modification, determination S15a (re-package test) performed in the flowchart of FIG. 21 is omitted. In the modification, after step S13b (application of a recovery voltage), the method proceeds to step S16 (burn-in test). In this way, the number of steps can be reduced.

Fifth Embodiment

Figure 23:
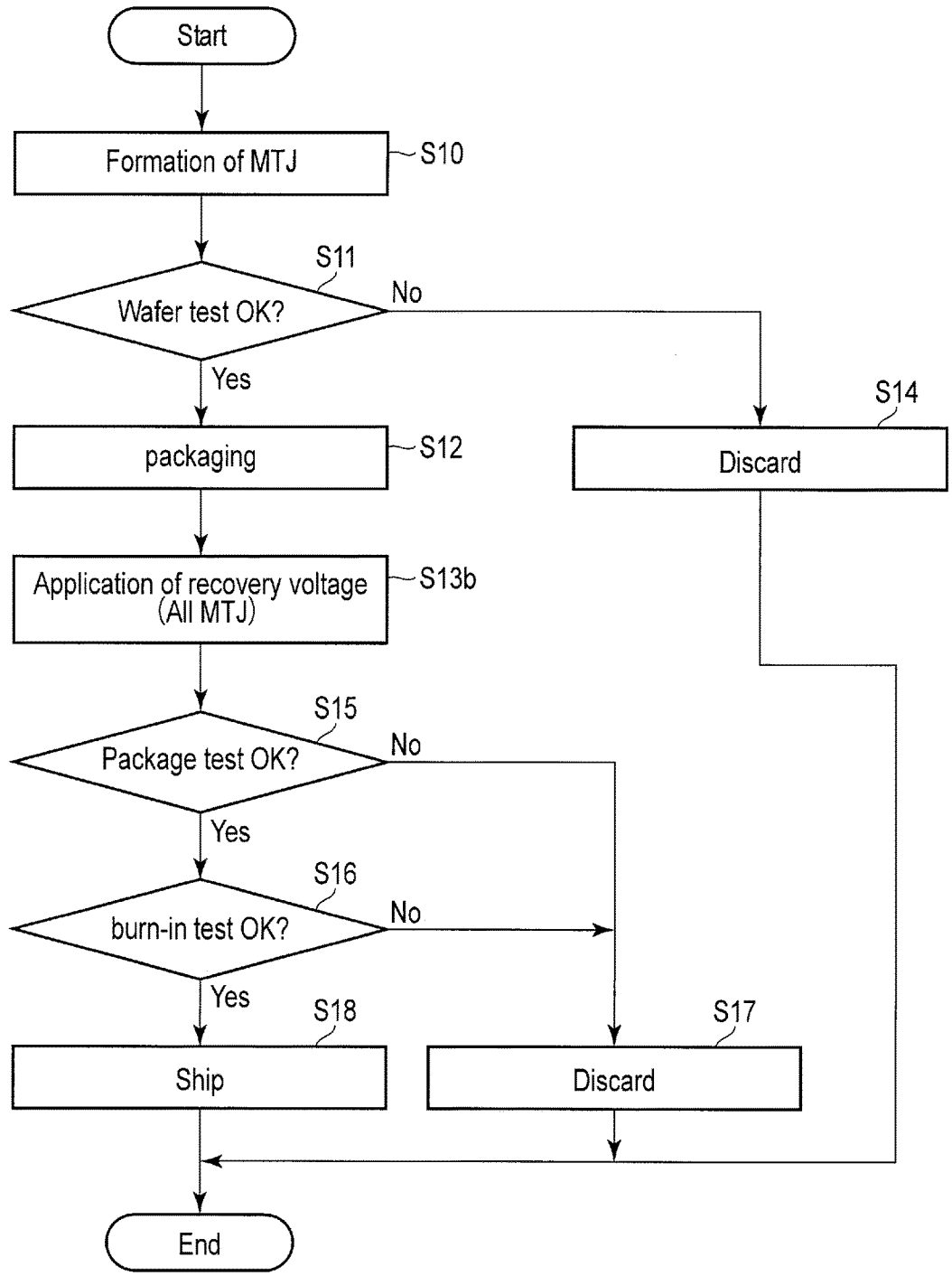
FIG. 23 is a flowchart showing a method of manufacturing a magnetic memory according to a fifth embodiment.

FIG. 23 is a flowchart for describing a method of manufacturing a magnetic memory according to a fifth embodiment. In the fourth embodiment, while the application of the recovery voltage (step S13b) is performed after the package test (S15), in the present embodiment, the application of the recovery voltage (step S13b) is performed before the package test (S15).

As in the fourth embodiment, steps S10 to 12 are performed.

[Step S13b]
The recovery voltage is applied to all of chip components.
[Step S15]
It is determined whether the chip components are good or not by a well-known method (package test).
[Step S16]
It is determined whether a chip component determined as being good in step S15 is good or not by burn-in test.
A chip component determined as being defective in step S16 is discarded and not shipped (S17).
[Step S18]
Meanwhile, a chip component determined as being good in step S16 is shipped.

Figure 24:
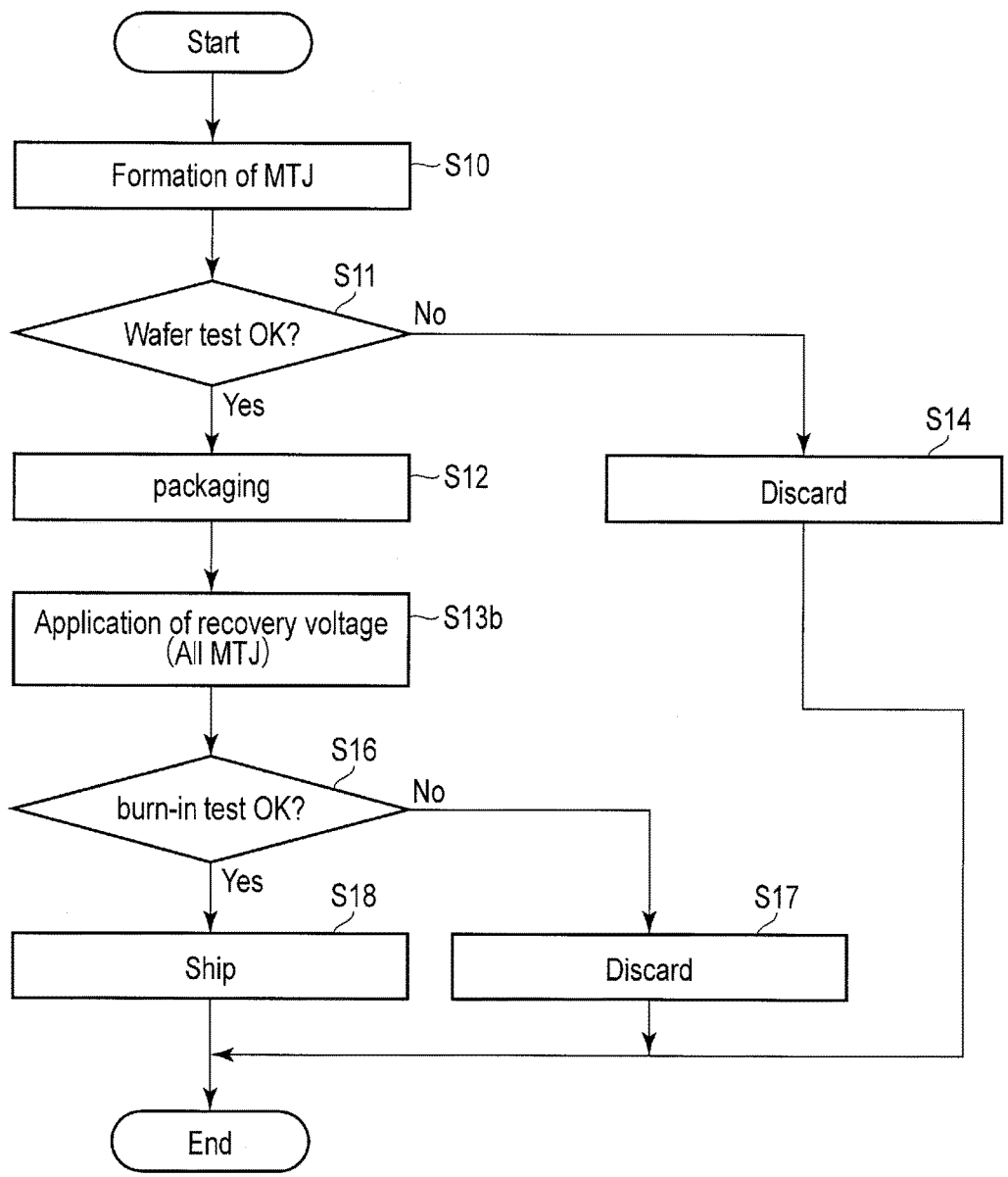
FIG. 24 is a flowchart showing a modification of the method of manufacturing the magnetic memory according to the fifth embodiment.

FIG. 24 is a flowchart showing a modification of the manufacturing method of the present embodiment. In the manufacturing method of this modification, package test S15 performed in the flowchart of FIG. 23 is omitted. In this way, the number of steps can be reduced.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiment described herein may be made without departing from the spirit of the invention. The accompanying claims and their equivalents are intended to cover such forms or modifications as would fall within the scope and spirit of the inventions.

What is claimed is:

1. A method for manufacturing a magnetic memory, the method comprising:
forming a magnetoresistive element on a substrate;
measuring an electrical characteristic of the magnetoresistive element;
determining whether the electrical characteristic of the magnetoresistive element is defective or not; and
applying a voltage to the magnetoresistive element when the electrical characteristic is determined as being defective, and not applying a voltage to the magnetoresistive element when the electrical characteristic is determined as not defective.

2. The method according to claim 1, wherein the measuring the electrical characteristic of the magnetoresistive element is performed in a state in which the magnetoresistive element is on the substrate.

3. The method according to claim 1, wherein the applying the voltage to the magnetoresistive element is performed in a state in which the magnetoresistive element is on the substrate.

4. The method according to claim 1, further comprising measuring an electrical characteristic of the magnetoresistive element again, after the voltage is applied to the magnetoresistive element.

5. The method according to claim 4, further comprising packaging a chip including the magnetoresistive element to which the voltage is applied.

6. The method according to claim 5, further comprising measuring an electrical characteristic of the packaged chip by burn-in test.

7. The method according to claim 6, wherein the burn-in test includes applying a voltage which is greater than or equal to 0.3 V and less than or equal to 0.4 V.

8. The method according to claim 7, wherein an application time of the voltage which is greater than or equal to 0.3 V and less than or equal to 0.4 V is one hour or longer.

9. The method according to claim 1, wherein the measuring the electrical characteristic of the magnetoresistive element is performed to a chip that is cut out from the substrate.

10. The method according to claim 9, wherein the applying the voltage to the magnetoresistive element is performed to the chip.

11. The method according to claim 10, wherein the measuring the electrical characteristic of the chip is performed by burn-in test.

12. The method according to claim 1, wherein the applying the voltage to the magnetoresistive element is performed to a chip that is cut out from the substrate.

13. The method according to claim 12, wherein the measuring the electrical characteristic of the chip is performed by burn-in test.

14. The method according to claim 1, wherein the voltage is lower than a breakdown voltage of the magnetoresistive element.

15. The method according to claim 1, wherein the voltage is higher than a write voltage of the magnetoresistive element.

16. The method according to claim 1, wherein the voltage is greater than 0.5 V and less than 0.9 V.

17. The method according to claim 1, wherein an application time of the voltage is 10 nanoseconds or more.

18. The method according to claim 1, wherein the magnetoresistive element includes a first magnetic layer, a nonmagnetic layer on the first magnetic layer, and a second magnetic layer on the nonmagnetic layer.

19. The method according to claim 1, wherein the applying the voltage to the magnetoresistive element comprises bringing the electrical characteristic determined as being defective into a normal electrical characteristic.

* * * * *